(12) United States Patent
Fujita

(10) Patent No.: US 11,406,025 B2
(45) Date of Patent: Aug. 2, 2022

(54) GLASS WIRING BOARD, METHOD FOR MANUFACTURING THE SAME, AND SEMICONDUCTOR DEVICE

(71) Applicant: TOPPAN PRINTING CO., LTD., Tokyo (JP)

(72) Inventor: Takashi Fujita, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 290 days.

(21) Appl. No.: 16/872,811

(22) Filed: May 12, 2020

(65) Prior Publication Data
US 2020/0275558 A1 Aug. 27, 2020

Related U.S. Application Data

(63) Continuation of application No. PCT/JP2018/045272, filed on Dec. 10, 2018.

(30) Foreign Application Priority Data

Dec. 11, 2017 (JP) ............................. JP2017-237104

(51) Int. Cl.
*H05K 1/03* (2006.01)
*H05K 3/42* (2006.01)
(Continued)

(52) U.S. Cl.
CPC ............. *H05K 3/426* (2013.01); *H05K 1/162* (2013.01); *H05K 1/165* (2013.01); *H05K 3/46* (2013.01); *H05K 1/0306* (2013.01)

(58) Field of Classification Search
CPC ........ H05K 3/426; H05K 1/162; H05K 1/165; H05K 3/46; H05K 1/0306
USPC .......................................................... 174/261
See application file for complete search history.

(56) References Cited

U.S. PATENT DOCUMENTS 9,954,267 B2 * 4/2018 Yun ........................... H01P 5/16
2007/0126529 A1 6/2007 Chen
(Continued)

FOREIGN PATENT DOCUMENTS

EP 3 220 417 A1 9/2017
JP H11-150373 A 6/1999
(Continued)

OTHER PUBLICATIONS

Extended European Search Report dated Dec. 23, 2020 for corresponding European Patent Application No. 18889581.7.
(Continued)

*Primary Examiner* — Sherman Ng
(74) *Attorney, Agent, or Firm* — Foley & Lardner LLP

(57) ABSTRACT

A glass wiring board in which a glass substrate with a small thickness is used as a core substrate to prevent glass breakage during manufacture, and an analog splitter composed of a capacitor and an inductor is formed on the glass substrate so as to stabilize the electrical properties of the analog splitter. An inductor is formed using a through electrode which is in contact with an inorganic adhesive layer on a glass substrate on which the inorganic adhesive layer is formed. A capacitor is formed using an insulating resin opening part formed in an insulating resin layer covering the glass substrate having wiring. The inductor and the capacitor are formed on different layers.

11 Claims, 3 Drawing Sheets

(51) Int. Cl.
*H05K 3/46* (2006.01)
*H05K 1/16* (2006.01)

(56) References Cited

U.S. PATENT DOCUMENTS

| | | | |
|---|---|---|---|
| 2012/0313226 A1* | 12/2012 | Koizumi | H01L 23/15 257/659 |
| 2013/0119555 A1* | 5/2013 | Sundaram | H01L 21/76843 257/774 |
| 2014/0104284 A1 | 4/2014 | Shenoy et al. | |
| 2017/0187345 A1 | 6/2017 | Yun et al. | |
| 2017/0250141 A1 | 8/2017 | Imayoshi | |

FOREIGN PATENT DOCUMENTS

| | | |
|---|---|---|
| JP | 2001-126946 A | 5/2001 |
| JP | 2006-060119 A | 3/2006 |
| JP | 2006-093261 A | 4/2006 |
| JP | 2009-518953 A | 5/2009 |
| JP | 4599488 B2 | 12/2010 |
| JP | 2016-502261 A | 1/2016 |
| JP | 2016-046267 A | 4/2016 |
| JP | 2017-073424 A | 4/2017 |
| WO | WO-2017/116616 A1 | 7/2017 |

OTHER PUBLICATIONS

Office Action dated Jan. 5, 2022 issued in a corresponding Japanese Patent Application No. 2017-237104, (6 pages).
International Searching Authority, "International Search Report," issued in connection with International Patent Application No. PCT/JP2018/045272, dated Mar. 5, 2019.
International Searching Authority, "Written Opinion," issued in connection with International Patent Application No. PCT/JP2018/045272, dated Mar. 5, 2019.

* cited by examiner

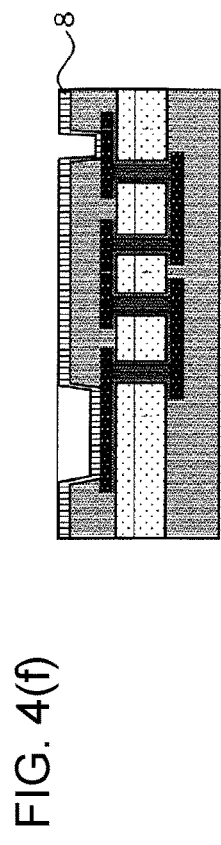
FIG. 4(a)
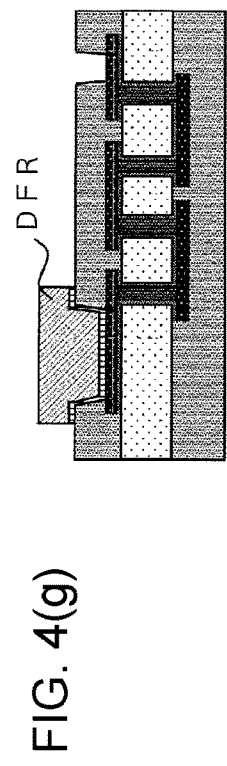
FIG. 4(b)
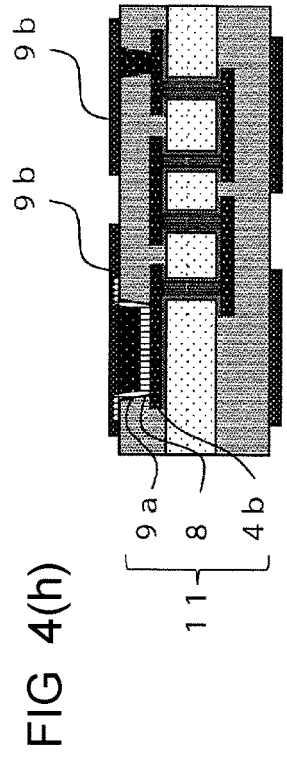
FIG. 4(c)
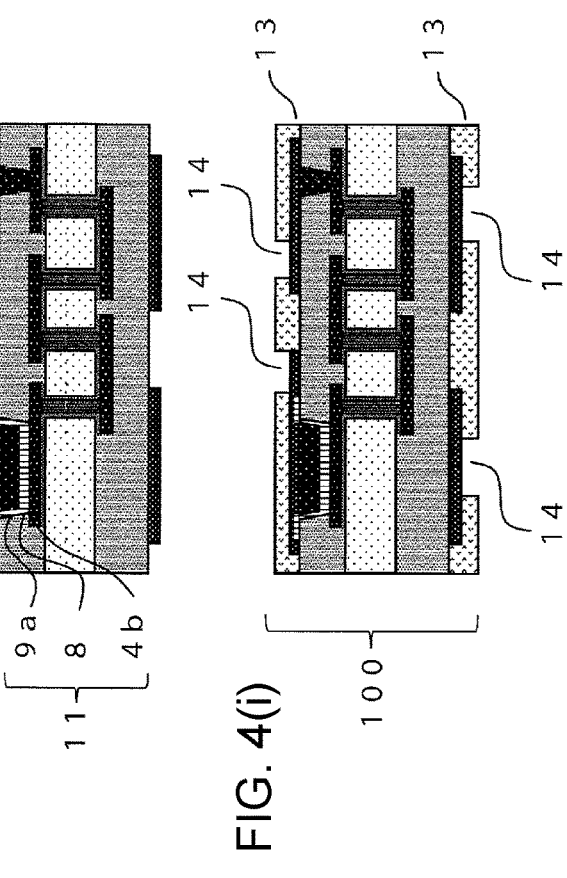
FIG. 4(d)
FIG. 4(e)
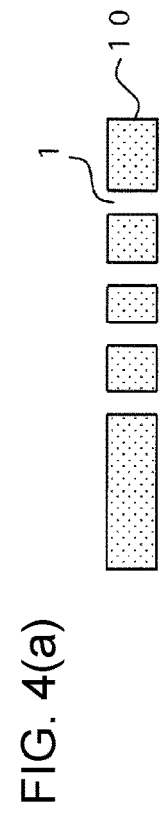
FIG. 4(f)
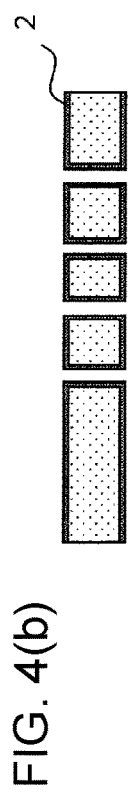
FIG. 4(g)
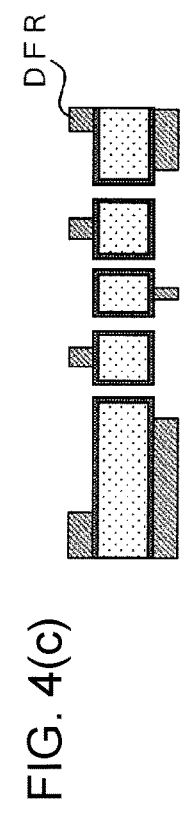
FIG. 4(h)
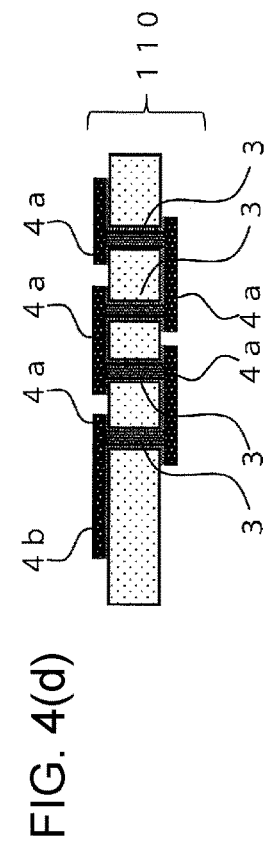
FIG. 4(i)

GLASS WIRING BOARD, METHOD FOR MANUFACTURING THE SAME, AND SEMICONDUCTOR DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/045272, filed on Dec. 10, 2018, which is based upon and claims the benefit of priority to Japanese Patent Application No. 2017-237104, filed on Dec. 11, 2017, the disclosures of which are all incorporated herein by reference in their entireties.

TECHNICAL FIELD

The present invention relates to techniques regarding a glass wiring board formed with a high frequency filter and a method for manufacturing the same, and a semiconductor device including the glass wiring board.

BACKGROUND ART

In mobile (cellular) communication, the advent of innovative technologies such as Long Term Evolution (LTE) and carrier aggregation has increased the need for installation of more analog duplexers (diplexers) with higher accuracy that include an inductor component and a capacitor component.

Diplexers have been conventionally fabricated using a substrate formed of a ceramic material, but the rapid development of electronic devices such as smartphones nowadays has also accelerated the need for diplexers that filter higher frequencies. However, it is challenging to reduce the size and improve the characteristics of the analog splitter made of traditional ceramic substrates. This is because the capacitor has surface irregularities that cause variation in characteristics, and an inductor wiring formed of a conductive material has surface irregularities that cause high electrical resistance on the skin part thereof.

In recent years, attention has centered on development of a high-frequency filter substrate. The high-frequency filter substrate is obtained by applying wiring technology to a core substrate made of silicon or a glass material. Such core substrates made of silicon or a glass material can improve the characteristics of analog splitters. This is because the irregularities of the wiring surface and thus the electrical resistance of the skin part can be reduced by smoothing the surfaces of capacitor electrodes in a manner to follow the smoothness of the substrate, and forming the inductor wiring by electroplating.

The silicon substrates or glass substrates may also have through electrodes referred to as through-silicon vias (TSVs) or through-glass vias (TGVs), which are formed by making fine through holes in the substrate and then filling the holes with a conductive substance. The through electrodes and wirings that connect the through electrodes can be used to form a coil structure on silicon substrates or glass substrates. Further, silicon substrates or glass substrates can be formed with 3D-structure inductor wiring with a magnetic permeability (H/m) using a substrate material as a core material.

The characteristics of the capacitor are allowed to be controlled by forming an optimum dielectric material by vacuum deposition used in semiconductor technology and flat panel technology, and providing upper and lower electrodes arranged to hold the dielectric material between them.

Silicon substrates and glass substrates will now be compared with each other. Silicon substrates are more suitable to micromachining than glass substrates, and have wiring processes and TSV formation processes that have been already established. However, silicon substrates have the drawback of being costly because of an inability to take them from the circumferential part of an inevitably circular silicon wafer and an inability to produce them in batches from a large wafer.

In contrast, glass wiring boards allow batch production from a large panel and may also be produced in a roll-to-roll process, leading to a significant cost reduction. The through holes in a glass wiring board are formed by electric discharge machining, laser processing, and hydrofluoric acid processing, whereas the through holes in a silicon wiring board are formed by gas etching. The longer processing time and wafer thinning process cause higher cost.

In terms of electrical characteristics, silicon substrates are semiconductor materials. To form wiring, silicon substrates need the formation of $SiO_2$ or other dielectric films, which have insulation properties. Thus, attention has centered on forming an analog splitter with a glass substrate, which is an insulating material.

As described above, a glass substrate allows a wiring circuit board to be produced inexpensively. However, as designs for inductor coils require thinner and thinner substrates, the glass substrates disadvantageously become more breakable in handling while being manufactured.

The glass substrate used for a glass wiring board has a thickness in the range of 50 to 1000 μm. In this range, the range of 400 to 1000 μm is typically used for flat-panel displays. A glass wiring board with such a thickness has a structure in which a wiring pattern is laminated on one side of the glass substrate. The glass wiring board can be handled in a stable manner by holding edges or suction on the reverse side of the glass substrate.

Semiconductor packages for glass wiring boards are required to be smaller and thinner. Accordingly, there is a growing need for glass wiring boards having thickness in the range of 50 to 400 μm, and wiring patterns are required to be laminated on both sides of a glass substrate.

As the thickness of the glass substrate is reduced, bending due to its own weight increases, and the risk of breakage of the glass substrate increases when there is a starting point for cracking or the like after distortion occurs. For these reasons, handling becomes more difficult as the thickness of the glass substrate is reduced. A glass wiring board has through holes with a diameter of 10 to several hundreds of micrometers formed in a glass substrate having such a thickness. The through holes have conductive through electrodes formed in them, whereas the glass substrate has wiring patterns formed on the front and back surfaces, and the through electrodes and the wiring patterns are electrically connected to form a wiring circuit board.

The wiring patterns may be formed of conductive metal thin films such as sputtered films. In other cases, to reduce the wiring resistance, the wiring patterns may be formed of electrolytic copper plating for thicker wiring.

When a wiring pattern is formed on a glass substrate, an inorganic adhesive layer having adhesion to the glass substrate is formed, and the wiring pattern is formed on the inorganic adhesive layer (see PTL 1).

When inductor wiring and the lower electrode of a capacitor are formed in the same layer on a glass substrate, a first layer formation step includes forming the through electrodes, the wiring patterns of the inductor, and the lower electrode of the capacitor. A second layer formation step includes forming a dielectric layer on the lower electrode of the capacitor, followed by an upper electrode. Then, the unrequired conductive area is decrease or removed by etching to complete the inductor pattern and the capacitor pattern.

In this method, since two wiring patterns and a dielectric layer pattern are formed in layers immediately above the glass, the stresses of the wiring patterns are accumulated. Therefore, in some cases, the concentration of stress on the interface between the glass substrate and the wiring patterns in each step may cause a crack in the glass substrate. In other cases, contact between the surface of the glass substrate and an external object produces a crack that is a starting point of breakage. Thus, in this method, the glass substrate being handled becomes more fragile.

Furthermore, when the upper electrode pattern of the capacitor is etched in the seed layer, and the lower electrode pattern of the capacitor is etched in the seed layer, the upper electrode pattern is etched twice. This etching varies the effective electrode area of the capacitor, thus causing the problem of variation in the electrical characteristics of the capacitor.

When the lower electrode for the capacitor is formed, by electrolytic plating, on an insulating resin layer made of an organic resin or the like, an electrolytic plating film for the lower electrode is formed on an uneven surface of the insulating resin layer. In this case, the lower electrode has, on its surface, an overlap between bumps on the electroplated film and the surface irregularities of the insulating resin layer, thereby causing problems of difference between the area of the capacitor electrode surface and its designed value, and the occurrence of a short circuit between the lower and upper electrodes.

As a method for forming the capacitance structure, for example, the formation method described in PTL 2 is indicated. PTL 2 proposes a multilayered printed wiring board formed with build-up wiring in which conduction layers and interlayer resin insulating layers are alternately laminated on an insulating substrate, and an adjacent inner layer conduction circuit and outer layer conduction circuit are connected by a via hole that is formed in the interlayer resin insulating layer provided therebetween. In the multilayered printed wiring board, an intermediate conduction layer is provided at a site where no via hole is formed in the interlayer resin insulating layer; a dielectric layer filled with a dielectric material containing at least a high dielectric material is formed between the inner layer conduction circuit in the interlayer resin insulating layer and the intermediate conduction layer; another via hole positioned immediately above the dielectric layer and filled with plating is formed between the outer layer conduction circuit in the interlayer resin insulating layer and the intermediate conduction layer; further, another interlayer resin insulating layer that covers the via hole, the other via hole and the outer layer conduction circuit is formed on the interlayer resin insulating layer; and still another via hole positioned immediately above the other via hole and filled by plating is formed in the other interlayer resin insulating layer.

In this method, three insulating layers including the core layer are required to form a capacitance structure, and the substrate thus becomes thick. Also, this method involves a problem that the cost increases due to an increase in number of steps.

[Citation List] [Patent Literature] [PTL 1] JP 2006-60119 A; [PTL 2] JP 4599488 B2

SUMMARY OF THE INVENTION

Technical Problem

An object of the present invention is to provide a glass wiring board in which glass breakage is suppressed even when using a glass substrate having a small thickness and in which the electrical characteristics of a capacitor are stable.

Solution to Problem

In order to solve the problem, one aspect of the present invention is a glass wiring board in which a high frequency filter having an inductor and a capacitor is formed on a glass substrate, the glass wiring board including:

a through hole formed in the glass substrate;

an inorganic adhesive layer formed on both surfaces of the glass substrate and a wall surface of the through hole;

an inductor of a coil structure having a through electrode that penetrates the through hole and is provided so as to be in contact with the inorganic adhesive layer, and a first wiring layer that is provided on the inorganic adhesive layer formed on the surfaces of the glass substrate and is electrically connected to the through electrode;

a lower electrode for a capacitor electrically connected to the inductor and composed of a part of the first wiring layer on at least one of the surfaces of the glass substrate;

an insulating resin layer formed on the glass substrate and made of an insulating resin that covers the first wiring layer;

an insulating resin opening part opened in the insulating resin layer such that a part of the lower electrode is exposed;

a capacitor having a dielectric layer formed on the lower electrode exposed in the insulating resin opening part and an upper electrode formed on the dielectric layer; and a second wiring layer electrically connected to the upper electrode and formed on the insulating resin layer to be connected to an external substrate.

Advantageous Effects of the Invention

According to the aspect of the present invention, a plurality of wiring patterns are laminated on both surfaces of the glass substrate, thereby making it possible to suppress the occurrence of cracks in the glass substrate due to the concentration of the stresses of the laminated wiring patterns between the glass substrate and the respective wiring patterns. Further, according to one aspect of the present invention, by coating a thin glass substrate with an insulating resin, concentration of external force during handling that would lead to glass breakage due to external stress or strain on the glass substrate is dispersed, and glass cracking can be avoided.

Further, according to the aspect of the present invention, it is possible to facilitate control of the electric characteristics of the capacitor and to avoid the occurrence of electric short circuit of the capacitor.

Thus, the aspect of the present invention can provide a glass wiring board which realizes both reduction of glass breakage during the manufacturing process even when using a glass substrate having a small thickness and stable control of the electrical capacitance of the capacitor.

In addition, the capacitance structure is realized using the two insulating layers including the core layer in the aspect of the present invention, which can contribute to the reduction in size of the substrate and the cost reduction.

BRIEF DESCRIPTION OF THE DRAWINGS

FIGS. 4(a), 4(b), 4(c), 4(d), 4(e), 4(f), 4(g), 4(h), and 4(i) are schematic sectional views showing steps of a method for forming the glass wiring board according to the first embodiment.

DETAILED DESCRIPTION

Figure 1:
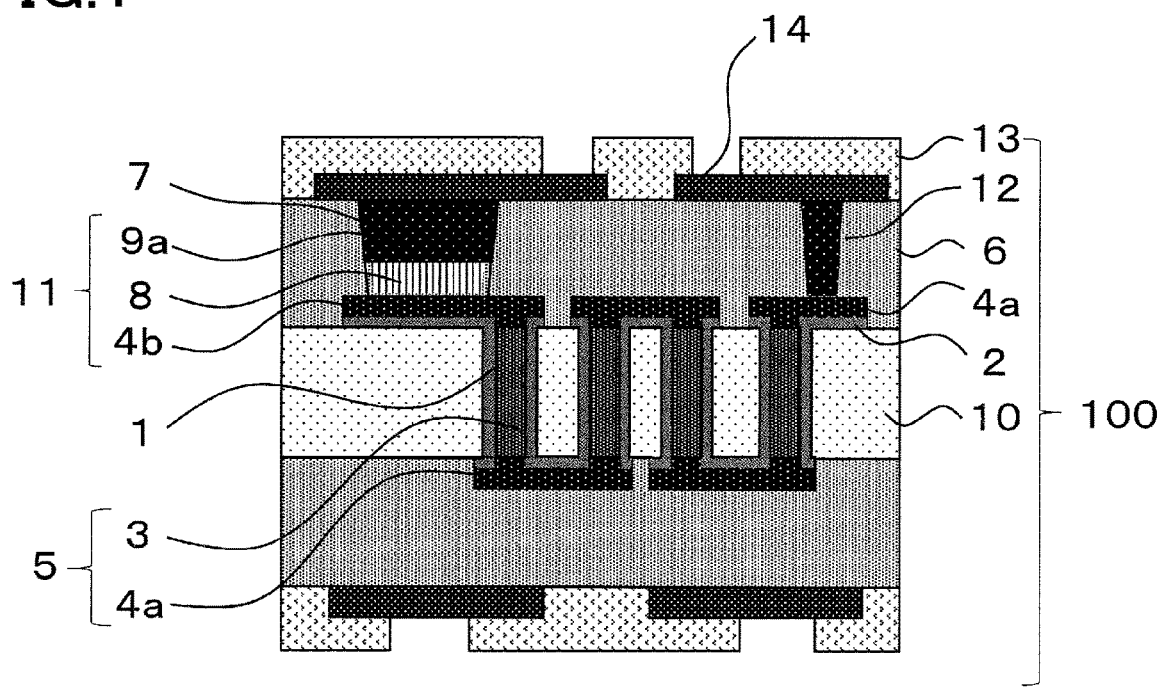
FIG. 1 is a schematic sectional view showing the structure of a glass wiring board according to a first embodiment.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Next, embodiments of the present invention will be described with reference to the drawings.

(First Embodiment)

As shown in FIG. 1, a glass wiring board 100 according to the present embodiment includes a glass substrate 10 as a core substrate having through holes 1; an inorganic adhesive layer 2 formed on a wall surface of the through holes 1 and front and back surfaces of the glass substrate 10; and an inductor 5 composed of through electrodes 3 and a first wiring layer 4a electrically connected to the through electrodes 3. The through electrodes 3 are formed in a state in which it is in contact with the inorganic adhesive layer 2 on the through holes 1. The first wiring layer 4a is electrically connected to the through electrodes 3 and is formed in a preset pattern on the inorganic adhesive layer 2 which is formed on a surface of the glass substrate 10.

Also, in the present embodiment, the glass wiring board 100 includes a lower electrode 4b for a capacitor, which is a part of the first wiring layer 4a, and a capacitor 11 composed of: a dielectric layer 8 that is formed on the lower electrode 4b and positioned at a bottom part of the insulating resin opening part 7 which is opened in the insulating resin layer 6 such that a part of the lower electrode 4b is exposed; and an upper electrode 9a formed on the dielectric layer 8.

Further, in the present embodiment, the glass wiring board 100 includes: a second wiring layer 9b connected to an external component, the second wiring layer 9b being formed on the insulating resin layer 6 made of an insulating resin; and a conductive via 12. The upper electrode 9a and the second wiring layer 9b are electrically connected to each other.

Also, in the present embodiment, the glass wiring board 100 includes a second insulating resin layer 13 made of an insulating resin, the second insulating resin layer being laminated so as to cover the capacitor 11, the insulating resin layer 6 and the second wiring layer 9b; and, further, a connection electrode part 14 for an external component, which is opened in a second insulating resin layer 13.

Hereinafter, detailed explanations will be given.

The glass substrate 10 is formed with the through holes 1. The through holes 1 is formed in the glass substrate 10 by one or two of a laser machining method, an electrical discharge machining method and a glass etching method.

The inductor 5 is provided with the inorganic adhesive layer 2. The inorganic adhesive layer 2 is formed on an inner wall of the through holes 1 formed in the glass substrate 10 and both surfaces of the glass substrate 10 by a sputtering or an electroless plating, and has conductivity and adhesion to glass.

In the present embodiment, the through electrodes 3 and the first wiring layer 4a are connected to form a solenoid-type inductor structure (coil structure). The through electrodes 3 is formed on the through holes 1 and the inorganic adhesive layer 2 by an electrolytic plating method or an electroless plating. The first wiring layer 4a is formed on the inorganic adhesive layer 2 by an electrolytic plating method, an electroless plating, or a screen printing.

Also, the lower electrode 4b is formed on the glass substrate 10. The lower electrode 4b is composed of a part of the first wiring layer 4a, and is connected to the conductive via 12 that is connected to an outer layer.

Here, the inorganic adhesive layer 2 is formed at interfaces between the glass substrate 10 and each of the outer peripheral surface of the through electrodes 3 and the first wiring layer 4a. Thereafter, the inorganic adhesive layer 2 formed in the other parts is removed by a dry etching method or a wet etching method so as to prevent a short circuit between the wiring patterns.

The capacitor 11 has a structure in which the dielectric layer 8 is sandwiched between the lower electrode 4b and the upper electrode 9a. The lower electrode 4b was formed, as a part of the first wiring layer, on the glass substrate 10 by a sputtering method, an electroless plating or an electrolytic plating method. The dielectric layer 8 was formed on the lower electrode 4b by a CVD film formation method, a sputtering deposition method or a screen printing. The upper electrode 9a was formed on the glass substrate 8 by an electroless plating or an electrolytic plating method.

As the method for forming the upper electrode 4b and the upper electrode 9a, an electrolytic plating method consisting of a semi-additive process, among these methods, is desirable from the viewpoints of cross-sectional shape of the wiring pattern and the dimensional control. As a seed layer, electroless plating or a sputtered film can be used.

The dielectric layer 8, if formed at least on the lower electrode 4b in the insulating resin opening part 7, can form a capacitor structure. In fact, the dielectric layer 8 is not limited to this, and may be formed on either or both of at least a part of an inner wall side surface of the insulating resin opening part 7 and at least a part of an upper surface of the insulating resin layer. The dielectric layer 8 is not required to be formed with high positional accuracy, and thus can easily form a capacitance structure.

In the case where the seed layer is formed on the insulating resin layer 6 by the electroless plating, the insulating resin layer surface is preferably roughened to an arithmetic surface roughness Ra of 50 nm to 300 nm through UV treatment or with an alkaline treatment liquid. In this case, the adhesion of the seed layer is improved. In the case where the wiring pattern is formed using electrolytic plating, the arithmetic surface roughness Ra of the plating surface is 50 nm to 150 nm since metal grain aggregates are aligned.

If the seed layer is formed of a sputtered film, a plasma treatment prior to sputtering provides adhesion to the insulating resin layer 6, thus allowing the seed layer to be formed with an arithmetic surface roughness Ra of 50 nm or less.

The wiring surface formed by electrolytic plating can also be smoothened by a polishing method using abrasive particles, a chemical polishing method using a chemical dissolving liquid, or cutting with a grinder.

By the method as described above, the lower electrode 4b may be formed so as to have an arithmetic surface roughness Ra of 150 nm or less by reducing the surface unevenness of one or both of the insulating resin layer 6 and the lower electrode 4b. The lower limit of the arithmetic surface roughness Ra of the lower electrode 4b is not particularly limited, and the arithmetic surface roughness Ra may be 0 nm or more.

An arithmetic surface roughness Ra exceeding 150 nm causes significant variation in electric characteristics of the capacitor, and electrical short circuit between the lower electrode pattern and the upper electrode pattern. Further, an arithmetic surface roughness Ra exceeding 200 nm increases a variation in thickness of the dielectric layer 8, and also increases variations in electrical characteristics of the capacitor and the number of electric short circuits occurring between the lower electrode pattern and the upper electrode pattern.

Here, in the present embodiment, the arithmetic surface roughness Ra was measured with a laser interferometer.

Portions other than the electrode pattern parts of the dielectric layer 8 were removed, by a dry etching method or a wet etching method, from above a masking material made of a photosensitive material or the like, which was been formed so as to cover the upper electrode 9a.

(Structure of Glass Wiring Board)

As described above, the glass wiring board 100 according to the present embodiment is a wiring circuit board with a high frequency filter including the inductor 5 and the capacitor 11. The inductor 5 is an inductor of a coil structure composed of the through electrodes 3 formed to contact the inorganic adhesive layer 2 within the through holes 1 of the glass substrate 10, and the first wiring layer 4a provided on the inorganic adhesive layer 2 on a surface of the glass substrate 10. The capacitor 11 has a structure in which the core wiring substrate composed of the glass substrate 10 having the first wiring layer 4a and another wiring is covered with the insulating resin layer 6, and the dielectric layer 8 formed in the insulating resin opening part 7 formed on the lower electrode 4b composed of a part of the first wiring layer 4a, in the insulating resin layer, is sandwiched between the upper and lower electrodes 9a and 4b. Also, the glass wiring board 100 has the second wiring layer 9b for connection to an external substrate.

(Thickness of Core Substrate)

The thickness of the glass substrate is 50 μm or more and 1000 μm or less, for example. The thickness of the glass substrate 10 serves as a wiring length of the through electrodes 3 of the inductor 5, and the number of turns of the inductor 5 can be set depending on the number of the through electrodes 3 to be connected to each other. The wiring length and the number of turns are not particularly limited in the present embodiment, and may be set depending on the required properties of the inductor.

(Structures of Through Hole and Through Electrode)

The maximum diameter of the through holes 1 is determined by the thickness of the glass substrate 10, the method for forming the through holes 1 and the wiring length of the first wiring layer 4a of the inductor 5. The method for forming the through holes 1 is not particularly limited, and examples thereof include methods using a $CO_2$ laser, short pulse laser or electric discharge machining. Also, a method of etching with an aqueous hydrofluoric acid-based solution or the like can be used as the method for forming the through holes 1. The first wiring layer 4a of the inductor 5 is formed of a land pattern that connects the through electrodes 3 and a linear pattern that connects the through electrodes to each other. In order to avoid unnecessary resistance increase of the first wiring layer 4a of the inductor 5, it is desirable that the dimensions of the land pattern and the linear pattern be equivalent to each other or that the difference in dimensions between these patterns be minimized. The maximum diameter of the through holes 1 can be 15 μm or more and 150 μm or less, and is desirably 100 μm or less from the viewpoint of the machinability of the through holes 1. A diameter of larger than 150 μm is not desirable as the maximum diameter of the through holes 1 since the dimensions of the inductor become large, leading to the increase in size of the analog splitter.

(Structure of Inductor)

In the wiring (first wiring layer) of the inductor 5, a conductive metal thin film having a thickness of 1 μm or less can also be used as the inorganic adhesive layer 2. In order to reduce the wiring resistance of the wiring patterns of the inductor 5, the wiring thickness can be increased by electroplating. However, when the first wiring layer 4a and the lower electrode 4b are formed on the same surface of the glass substrate, the film stress increases along with the increase in wiring thickness, thereby causing a possibility that glass cracking may occur at an interface between one of the first wiring layer 4a and the lower electrode 4b and the glass substrate 10. Such glass cracking may occur with an electroplated film thickness of 30 μm and a film stress of 2600 N/m, while it may be avoided with an electroplated film thickness of 25 μm and a film stress of 2000 N/m or less. Thus, the thickness of the wiring (first wiring layer) of the inductor 5 is preferably 25 μm or less. Also, when the wiring thickness is small, the wiring resistance increases so that the desired properties cannot be obtained. Therefore, the thickness of the wiring (first wiring layer) of the inductor 5 is desirably 2 μm or more.

The through electrodes 3 and the first wiring layer 4a are connected to form a solenoid-type coil structure.

(Material for Inorganic Adhesive Layer)

The inorganic adhesive layer 2 may be a single-layer film of a single material selected from, or a single-layer or multilayered film of a combination of two or more materials selected from tin oxide, indium oxide, zinc oxide, nickel, nickel phosphide, chromium, chromium oxide, aluminum nitride, copper nitride, aluminum oxide, tantalum, titanium, and copper. The method for forming the inorganic adhesive layer 2 is not particularly limited, and can be wet coating, sputtering, CVD film formation, electroless plating or the like. These formation methods can be used to obtain adhesion of the inorganic adhesive layer 2 to the glass substrate 10 and to form the inorganic adhesive layer 2 on the inner wall of the through holes 1 without blocking the through holes 1.

(Materials for Through Electrode and Wiring Pattern)

The through electrodes 3 and the first wiring layer 4a may be made of a single metal selected from, or an alloy or a multilayered film of two or more metals selected from aluminum, copper, chromium, titanium, silver, gold, nickel, platinum, palladium, ruthenium, tin, tin silver, tin silver copper, tin copper, tin bismuth and tin lead.

The film formation method is not particularly limited, but is desirably electrolytic plating, electroless plating or screen printing in order to reduce the wiring resistance and to obtain electrical bonding with the wiring of the external substrate.

The method for forming the first wiring layer 4a can be a semi-additive method by electrolytic plating or a subtractive method after electrolytic plating film formation. As an electrical bonding part with the wiring of the external substrate, a conductive surface can be formed in a portion where a wiring pattern is necessary by an electroless plating or a screen printing.

The dielectric layer 8 may be made from any combination of any one metal of aluminum, copper, chromium, titanium, silver, gold, nickel, platinum, palladium, ruthenium, and tantalum, oxides, nitrides, and alloys of these metals, and polysilicon.

The dielectric material is sandwiched between the lower electrode 4b and the upper electrode 9a to form a capacitor structure.

(Material for Insulating Resin)

The insulating resin for the insulating resin layer 6 that covers the core wiring substrate composed of the glass substrate 10 formed with wiring may be made of any one material of or a composite of at least two materials of epoxy resin, phenolic resin, polyimide resin, cycloolefin, PBO resin and an acrylic resin. Further, thermosetting resin or photocurable resin may also be used as the insulating resin.

The insulating resin preferably has a Young's modulus of 2 GPa or more and 15 GPa or less. The insulating resin covers both surfaces of the core wiring substrate, so that the stresses from the first wiring layer 4a and the lower electrode 4b are dispersed in the insulating resin layer 6 that is in contact with the glass substrate. As a result, it is possible to suppress occurrence of cracking in the glass substrate 10 due to the concentration of the stress at interfaces between the glass substrate 10 and the first wiring layer 4a and the lower electrode 4b, respectively.

Also, the glass substrate 10 having a small thickness is covered with the insulating resin at an early stage of the process, thereby dispersing the concentration of external force leading to the glass breakage caused by stress and external distortion acting on the glass substrate. As a result, glass breakage at the time of handling of the core wiring substrate can be avoided.

The Young's modulus is about 80 GPa for the glass substrate, and is about 130 GPa for copper, about 107 GPa for titanium and about 200 GPa for nickel among the metal materials. The wiring pattern has a higher Young's modulus than that of the glass substrate, and differences in ease of warpage and bending of the core wiring substrate are caused between a region formed with a wiring pattern and a region with no wiring pattern.

The Young's modulus of the insulating resin layer 6 that covers the core wiring substrate is desirably equivalent to or smaller than that of the glass substrate. In particular, the use of insulating resin layers 6 that have a Young's modulus of less than 15 GPa enables the stress of the first wiring layer 4a to be dispersed and the glass substrate to be provided with bendability and flexibility. Although the lower limit of the Young's modulus is not particularly specified, a Young's modulus higher than 2 GP enables the insulating resin layers 6 to provide a stress reduction effect.

The Young's modulus of the insulating resin layers 6 was measured in accordance with JIS K7127.

(Structure of Capacitor)

Either a single metal, or a compound of two or more metals, selected from copper, silver, gold, nickel, platinum, palladium, ruthenium, tin, tin silver, tin silver copper, tin copper, tin bismuth and tin lead can be used in the lower and upper electrodes 4b and 9a.

The method for forming the lower and upper electrodes 4b and 9a is not particularly limited, but is desirably electrolytic plating or electroless plating in order to reduce the wiring resistance.

The wiring patterns may be formed by a semi-additive process using electroplating or a subtractive process subsequent to electroplating. As an electrical bonding part with the wiring of the external substrate, a conductive surface can be formed in a portion where a wiring pattern is necessary by an electroless plating or a screen printing.

The material for the dielectric layer 8 may be selected from any combination groups of oxides, nitrides, alloys, or nitrides of polysilicon and the like. Examples of the material for the dielectric layer 8 may include silicon oxide, silicon nitride, barium titanate, strontium, tantalum pentoxide, lead zirconate titanate, strontium titanate, aluminum oxide, benzocyclobutane resin, cardo resin, and polyimide resin.

The method for forming the dielectric layer 8 can be CVD, sputtering, screen printing or the like. The dielectric layer 8 is sandwiched between the lower electrode pattern and the upper electrode pattern to provide the capacitor structure.

(Method for Manufacturing Glass Wiring Board)

A method for manufacturing the glass wiring board according to the present embodiment includes a core wiring substrate formation step, a step of forming the second wiring layer 9b, and a step of exposing the connection electrode part 14 to an external component. The core wiring substrate formation step involves: a through hole formation step of forming the through holes 1 in the glass substrate 10; forming the inorganic adhesive layer 2 on the surfaces of the glass substrate 10 and the wall surface of the through holes 1; forming the inductor 5 including the through hole 3 that penetrates the through holes 1 and the first wiring layer 4a on the inorganic adhesive layer 2 on a surface of the glass substrate 10; and forming, on the inorganic adhesive layer 2, the lower electrode 4b for a capacitor which is connected to the inductor 5 and composed of a part of the first wiring layer 4a. The step of forming the second wiring layer 9b involves covering both surfaces of the formed core wiring substrate with an insulating resin, forming the opening part 7 in the insulating resin such that a part of the lower electrode is exposed, forming a dielectric film that forms the dielectric layer 8 and the upper electrode pattern on the lower electrode 4b via the opening part 7 to form the capacitor 11, and forming the second wiring layer 9b for connection to the external substrate on the insulating resin such that the second wiring layer 9b is electrically connected to the upper electrode 9a. The step of exposing the connection electrode part 14 to an external component involves laminating a second insulating resin that forms the second wiring layer 13 onto the insulating resin, the capacitor 11 and the second wiring layer 9b and forming an opening for exposing a part of the second wiring layer 9b in the second insulating resin, thereby exposing the connection electrode part 14 to an external component.

The second insulating resin layer 13 may be formed of the same insulating resin as the insulating resin layers 6 covering the core wiring board.

The second insulating resin layer 13 may also be a solder resist or other insulating resin layer used as an outer layer material. The number of insulating resin layers and the total number of wiring patterns formed on them are not particularly specified but may be selected as appropriate in accordance with the product design.

(Structure of Semiconductor Device)

Components such as semiconductor chips, capacitors and inductors can also be mounted on the glass wiring board 100 of the present embodiment. The semiconductor device may also have a structure in which the glass wiring board 100 of the present embodiment is mounted on another wiring substrate.

In the following description, a glass wiring board in which an analog splitter is formed using a glass substrate as a core substrate will be explained.

(Second Embodiment)

Figure 2:
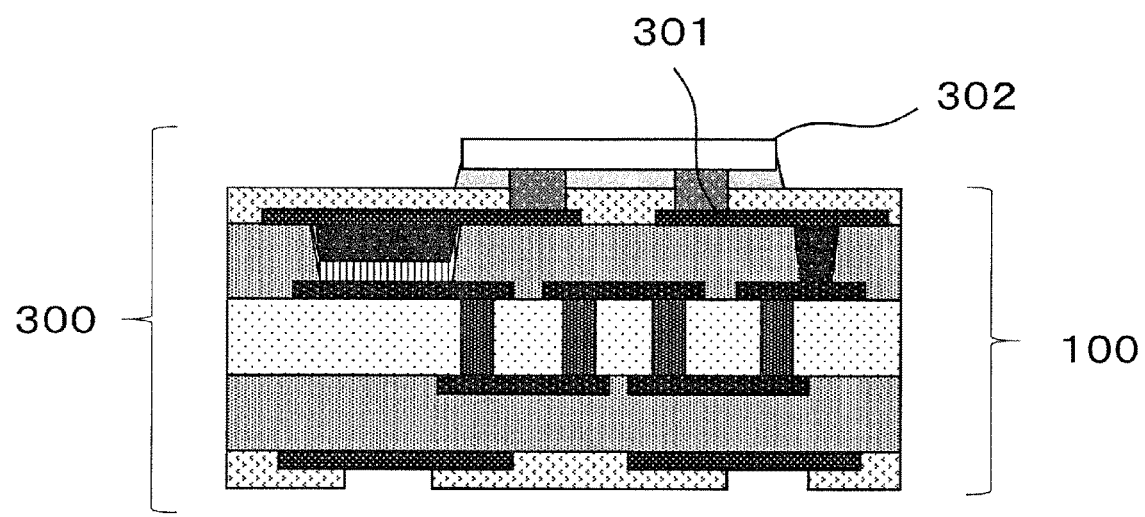
FIG. 2 is a schematic cross-sectional view showing the structure of a semiconductor device according to a second embodiment in which a chip and a semiconductor component are mounted on the glass wiring board.

FIG. 2 is a schematic cross-sectional view of the structure of a semiconductor device 300 with a chip component and a semiconductor chip 302 mounted on the glass wiring board 100. As shown in FIG. 2, the semiconductor device 300 is formed by mounting a semiconductor chip 302, for example, via a connection pad 301 on the glass wiring board 100 described above.

(Third Embodiment)

Figure 3:
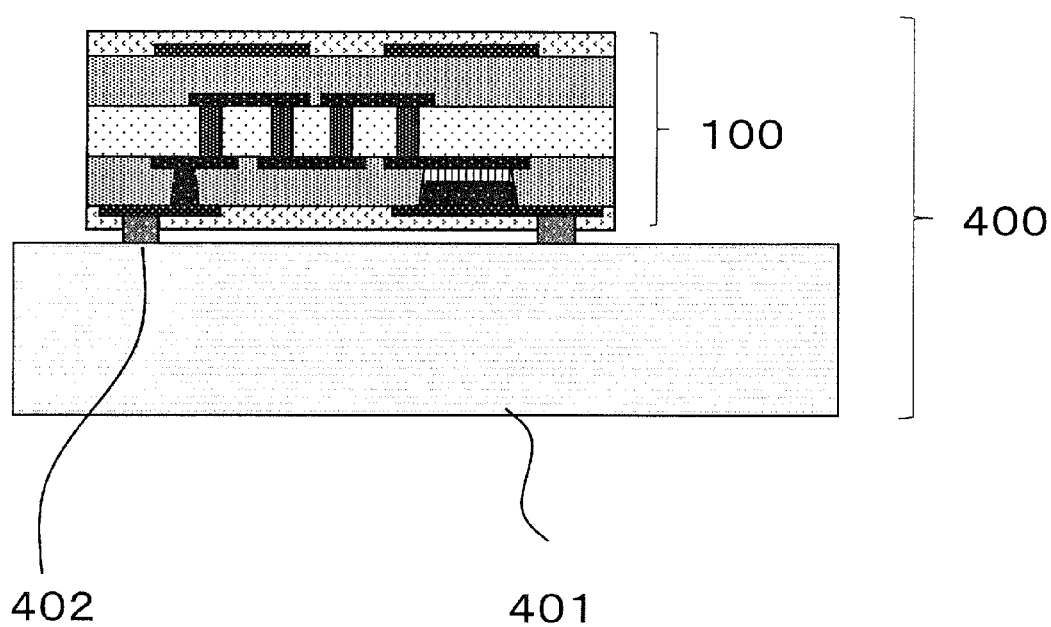
FIG. 3 is a schematic cross-sectional view showing a structure according to a third embodiment in which the glass wiring board is mounted on another wiring substrate.

FIG. 3 is a schematic cross-sectional view showing a structure in which the glass wiring board 100 is mounted on another wiring substrate 401. As shown in FIG. 3, a semiconductor device 400 is formed by mounting the glass wiring board 100 described above on the wiring substrate 401 via a connection pad 402.

As described above, the glass wiring board of the present embodiment is formed with: an inductor composed of a through electrode and a first wiring layer that are each in contact with an inorganic adhesive layer on the glass substrate; and a capacitor in an opening part opened in an insulating resin layer that is formed on the glass substrate and covers the first wiring layer, and has a second wiring layer for connection to an external substrate.

It is preferred to form the inorganic adhesive layer on the glass substrate, to form the through electrode and inductor wiring so as to be laminated onto the inorganic adhesive layer, and to remove the inorganic adhesive layer by etching to form the inductor and a wiring pattern connected to the inductor and composed of a lower electrode pattern composed of the first wiring layer.

The insulating resin covers with the core wiring substrate in which the thus-obtained glass substrate is used as the core substrate, the insulating resin on the lower electrode is opened to form the opening part, and the capacitor is formed in the opening part. After the formation of the inductor wiring, the core wiring substrate is covered with the insulating resin, thereby making it possible to disperse the concentration of external force leading to glass breakage in the core wiring substrate and to reduce the risk of glass substrate breakage in and after the step of forming the capacitor.

The capacitor is formed in the insulating resin opening part opened on the lower electrode, thereby making it possible to suppress side etching of the seed layer and the dielectric layer at an interface of the dielectric layer of the capacitor and to stably control the electrical characteristics of the capacitor.

Surface unevenness of the insulating resin forming the capacitor or surface unevenness of the lower electrode is reduced, thereby making it possible to stably control the electrical characteristics of the capacitor and to avoid the occurrence of electrical shorts between the lower and upper electrodes.

In the present embodiment, a plurality of wiring patterns are laminated on both surfaces of the glass substrate, thereby making it possible to suppress the occurrence of cracks in the glass substrate due to the concentration of the stresses of the laminated wiring patterns between the glass substrate and the wiring patterns. In addition, when the thin glass substrate is covered with the insulating resin at early stages in the process of producing the glass wiring board, the glass core substrate can avoid glass breakage during handling by distributing external stress and concentrated external force that may cause glass breakage due to distortion.

Further, in the present embodiment, it is possible to facilitate control of the electrical characteristics of the capacitor and to avoid the occurrence of a short circuit of the capacitor.

Accordingly, the present embodiment can provide a glass wiring board which realizes both reduction of glass breakage during the manufacturing process when using a glass substrate having a small thickness and stable control of the electric capacity of the capacitor.

In addition, in the present embodiment, the capacitance structure is realized using the two insulating layers including the core layer. Therefore, reduction in size of the substrate and cost reduction can be realized.

EXAMPLES

Examples according to the present invention will be described with reference to FIGS. 4(a), 4(b), 4(c), 4(d), 4(e), 4(f), 4(g), 4(h), and 4(i). The present example corresponds to a method for manufacturing the glass wiring board according to the above first embodiment.

First, through holes 1 having an opening diameter of 80 μm are formed in a low-expansion glass substrate 10 (thickness: 300 μm; and CTE: 3.5). In the present example, the through holes 1 were formed by, first, treatment of machining with a short pulse laser and, second, treatment of etching with an aqueous hydrofluoric acid solution (see FIG. 4(a)).

Next, a Ti film and a Cu film were laminated and formed as the inorganic adhesive layer 2 on the surfaces of a glass substrate by a sputtering method. In order to reinforce a thin portion of the sputtered film within the respective through holes, an electroless nickel plating film as the inorganic adhesive layer 2 was formed (see FIG. 4(b)).

Then, the inorganic adhesive layer 2 was used as a seed layer for forming the inductor 5 and the first wiring layer 4a composed of a land pattern connected to an outer layer by a semi-additive method. A dry film resist DFR (RY-3525 (thickness: 25 μm), manufactured by Hitachi Chemical Co., Ltd.) was laminated on both surfaces of the glass substrate 10, and then an opening part was formed by photolithography (see FIG. 4(c)).

Next, the first wiring layer 4a of the inductor 5 and the through electrodes 3 were formed by electrolytic copper plating so as to have a wiring thickness of 15 μm, and unnecessary portions of the seed layer were removed by etching to form a core wiring substrate 110 (see FIG. 4(d)).

Next, both surfaces of the core wiring substrate 110 were covered with an insulating resin (insulating resin ABF having a thickness of 25 μm, manufactured by Ajinomoto Fine-Techno Co., Inc.) to form the insulating resin layer 6. At the same time, the insulating resin opening part 7 for forming a capacitor and the conductive via 12 for establishing conduction with the first wiring layer 4a on a surface of the core wiring substrate 110 were formed (see FIG. 4(e)).

A surface of the insulating resin layer 6 was treated with an alkaline surface roughening liquid to achieve an arithmetic surface roughness Ra of 60 nm. A Ti film was formed by sputtering, and a SiN film having a thickness of 400 nm was further formed as a dielectric film by a CVD film formation method (see FIG. 4(f)). The arithmetic surface roughness Ra of the obtained lower electrode pattern was 150 nm.

For patterning of the dielectric layer 8, the dry film resist DFR was formed on a site corresponding to the dielectric layer 8, and the SiN film and Ti film in portions other than the dielectric layer 8 were removed by dry etching (see FIG. 4(g)).

The pattern of the dielectric layer 8 has only to be formed at least on the lower electrode 4b in the insulating resin opening part 7. The pattern of the dielectric layer 8 is not limited to this, and may be formed on either or both of a side surface of the insulating resin opening part 7 and an upper surface of the insulating resin layer 6.

For formation of the upper electrode 9a and the second wiring layer 9b, electroless copper plating was formed as the seed layer, and the upper electrode 9a and the second wiring layer 9b were formed so as to have a wiring thickness of 15 μm by the semi-additive method.

The upper electrode 9a was formed so as to cover the dielectric layer 8 by the semi-additive method. Further, the second wiring layer 9b was formed so as to have a wiring thickness of 10 μm. Then, the seed layers in unnecessary portions, other than the upper electrode pattern and the second wiring layer 9b, were removed by wet etching and dry etching, thereby forming the capacitor 11 composed of the lower electrode 4b, the dielectric layer 8 and the upper electrode 9a, and the second wiring layer 9b (see FIG. 4(h)).

Next, the second wiring layer 13 having a thickness of 35 μm was laminated on the insulating resin layer 6 and the second wiring layer 9b, and the connection electrode part 14 for establishing external conduction was exposed. A solder resist pattern was formed, and thus the glass wiring board 100 was formed (see FIG. 4(i)).

In the present example, a solder resist was laminated on the second wiring pattern. However, any number of wiring layers to be laminated and any methods for forming the solder resist, the Ni plating in the opened part of the insulating resin, the Au plating and the solder formation can be selected without any particular limitation.

In the present example, the glass wiring board prepared in the above process was prepared without glass breakage during the process. The obtained electric characteristics were electrical property values of the capacitor as designed. The number of short circuits occurring in the capacitor was suppressed, and an analog splitter usable at high frequencies was obtained.

The scope of the present invention is not limited to the illustrative embodiment illustrated and described above, but also includes all embodiments that provide effects equivalent to those intended by the present invention. Furthermore, the scope of the present invention is not limited to combinations of features limited by the claims, but may be limited by any desired combination of specific features among all the disclosed features.

INDUSTRIAL APPLICABILITY

The glass wiring board and method for manufacturing the same according to the present invention can be used in semiconductor components having functional materials including an inductor and a capacitor.

REFERENCE SIGNS LIST

100: Glass wiring board; 110: Core wiring substrate; 300: Semiconductor device; 301: Connection pad; 302: Semiconductor chip; 400: Semiconductor device; 401: Wiring substrate; 402: Connection pad; 1: Through hole; 2: Inorganic adhesive layer; 3: Through electrode; 4a: First wiring layer; 4b: Lower electrode; 5: Inductor; 6: Insulating resin layer; 7: Insulating resin opening part; 8: Dielectric layer; 9a: Upper electrode; 9b: Second wiring layer; 10: Glass substrate; 11: Capacitor; 12: Conductive via; 11: Second insulating resin layer; 14: Connection electrode part with external component.

What is claimed is:

1. A glass wiring board in which a high frequency filter having an inductor and a capacitor is formed on a glass substrate, the glass wiring board, comprising: a through hole formed in the glass substrate; an inorganic adhesive layer formed on both surfaces of the glass substrate and on a wall surface of the through hole; an inductor of a coil structure having a through electrode that penetrates the through hole and is provided so as to be in contact with the inorganic adhesive layer, and a first wiring layer that is provided on the inorganic adhesive layer formed on the surfaces of the glass substrate and is electrically connected to the through electrode; a lower electrode for a capacitor electrically connected to the inductor and composed of a part of the first wiring layer on at least one of the surfaces of the glass substrate; an insulating resin layer formed on the glass substrate and made of an insulating resin that covers the first wiring layer; an insulating resin opening part opened in the insulating resin layer such that a part of the lower electrode is exposed; a capacitor having a dielectric layer formed on the lower electrode exposed at the insulating resin opening part and an upper electrode formed on the dielectric layer, wherein the dielectric layer is formed on either or both of at least a part of an inner wall side surface of the insulating resin opening part and at least a part of a surface of the insulating resin layer; and a second wiring layer electrically connected to the upper electrode and formed on the insulating resin layer to be connected to an external substrate.

2. The glass wiring board of claim 1, wherein the surface of the lower electrode on which the dielectric layer is formed has an arithmetic surface roughness Ra of 150 nm or less.

3. The glass wiring board of claim 1, wherein the glass substrate has a thickness of 50 μm or more and 1000 μm or less.

4. The glass wiring board of claim 1, wherein the through electrode has a maximum diameter of 15 μm or more and 150 μm or less.

5. The glass wiring board of claim 1, wherein the first wiring layer has a thickness of 2 μm or more and 25 μm or less.

6. The glass wiring board of claim 1, wherein the inorganic adhesive layer is a single-layer film of a single material selected from, or a single-layer or multilayered film of a combination of two or more materials selected from tin oxide, indium oxide, zinc oxide, nickel, nickel phosphide, chromium, chromium oxide, aluminum nitride, copper nitride, aluminum oxide, tantalum, titanium and copper.

7. The glass wiring board of claim 1, wherein the through electrode and the first wiring layer are each made of a metal, or a compound of two or more metals, selected from copper, silver, gold, nickel, platinum, palladium, ruthenium, tin, tin silver, tin silver copper, tin copper, tin bismuth and tin lead.

8. The glass wiring board of claim 1, wherein the insulating resin is a material, or a composite material of a combination of two or more materials, selected from epoxy resin, phenolic resin, polyimide resin, cycloolefin, PRO resin and acrylic resin.

9. A semiconductor device in which a semiconductor chip is mounted on the glass wiring board of claim 1.

10. A semiconductor device in which the glass wiring board of claim 1 is mounted as an analog splitter on another wiring substrate.

11. A method for manufacturing a glass wiring board comprising: a through hole formation step of forming a through hole in a glass substrate; a core wiring substrate formation step of forming an inorganic adhesive layer on a surface of the glass substrate and a wall surface of the through hole, forming an inductor composed of a through electrode that penetrates the through hole formed with the inorganic adhesive layer and a first wiring layer that is provided on the inorganic adhesive layer formed on a surface of the glass substrate and is electrically connected to the through electrode, and then forming a lower electrode for a capacitor that is connected to the inductor and composed of a part of the first wiring layer on at least one of the surfaces of the glass substrate; a step of covering, with an insulating resin, both surfaces of the glass substrate on which the inductor and the lower electrode have been formed in the core wiring substrate formation step, forming an opening part in the insulating resin such that a part of the lower electrode is exposed, and forming a dielectric film and an upper electrode on the lower electrode via the opening part to form a capacitor and forming a second wiring layer electrically connected to the upper electrode and formed on the insulating resin layer to be connected to an external substrate, wherein the dielectric film is formed on either or both of at least a part of an inner wall side surface of the opening part in the insulating resin and at least a part of a surface of the insulating resin layer; and a step of laminating a second insulating resin on the insulating resin, the capacitor and the second wiring layer and forming an opening for exposing a part of the second wiring layer in the second insulating resin.

* * * * *